(12) United States Patent
Wang

(10) Patent No.: US 10,978,114 B2
(45) Date of Patent: Apr. 13, 2021

(54) SHIFT REGISTER UNIT, GATE DRIVING CIRCUIT, DISPLAY DEVICE AND DRIVING METHOD TO REDUCE NOISE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Zhichong Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/462,255

(22) PCT Filed: Oct. 31, 2018

(86) PCT No.: PCT/CN2018/113058
§ 371 (c)(1),
(2) Date: May 20, 2019

(87) PCT Pub. No.: WO2019/184339
PCT Pub. Date: Mar. 10, 2019

(65) Prior Publication Data
US 2020/0273503 A1 Aug. 27, 2020

(30) Foreign Application Priority Data
Mar. 30, 2018 (CN) .................. 201810276380.X

(51) Int. Cl.
*G11C 7/10* (2006.01)
*G11C 7/02* (2006.01)
(Continued)

(52) U.S. Cl.
CPC ......... *G11C 7/1036* (2013.01); *G09G 3/3674* (2013.01); *G11C 7/02* (2013.01);
(Continued)

(58) Field of Classification Search
CPC .......... G11C 7/1036; G11C 7/22; G11C 7/20; G11C 7/02; G09G 3/3674; G09G 2300/0408; G09G 2310/0286
See application file for complete search history.

(56) References Cited

U.S. PATENT DOCUMENTS

| 8,982,107 B2* | 3/2015 | Takahashi ................ G09G 3/20 345/100 |
| 10,657,921 B2 | 5/2020 | Zhao et al. |

(Continued)

FOREIGN PATENT DOCUMENTS

| CN | 104835465 | 8/2015 |
| CN | 105632451 A | 6/2016 |

(Continued)

OTHER PUBLICATIONS

International Search Report and Written Opinion in corresponding International Patent Application No. PCT/CN2018/113058 dated Jan. 31, 2019. 23 pages.

(Continued)

*Primary Examiner* — Sultana Begum
(74) *Attorney, Agent, or Firm* — Leason Ellis LLP

(57) ABSTRACT

A shift register unit, a gate driving circuit, a display device and a driving method are disclosed. The shift register unit includes an input circuit, a first reset circuit, an output circuit, and a node control circuit. The input circuit is configured to control a level of a first node in response to an input signal; the first reset circuit is configured to reset the first node in response to the first reset signal; the output circuit is configured to output a driving signal to an output (Continued)

terminal under control of the level of the first node; and the node control circuit is configured to control a level of a second node in response to the driving signal.

19 Claims, 7 Drawing Sheets

(51) Int. Cl.
  *G09G 3/36* (2006.01)
  *G11C 7/20* (2006.01)
  *G11C 7/22* (2006.01)
(52) U.S. Cl.
  CPC ............... *G11C 7/20* (2013.01); *G11C 7/22* (2013.01); *G09G 2300/0408* (2013.01); *G09G 2310/0286* (2013.01)

(56) References Cited

U.S. PATENT DOCUMENTS

| | | |
|---|---|---|
| 10,665,191 B2 | 5/2020 | Wang et al. |
| 2010/0260312 A1 | 10/2010 | Tsai et al. |
| 2011/0002437 A1 | 1/2011 | Su et al. |
| 2017/0039971 A1* | 2/2017 | Huang ................ G11C 19/184 |
| 2018/0226132 A1 | 8/2018 | Gao et al. |
| 2018/0366067 A1* | 12/2018 | Jang ..................... G09G 3/3674 |
| 2019/0139475 A1 | 5/2019 | Wang et al. |
| 2020/0090610 A1* | 3/2020 | Wang ................... G09G 3/3677 |

FOREIGN PATENT DOCUMENTS

| | | |
|---|---|---|
| CN | 106023914 A | 10/2016 |
| CN | 106448600 | 2/2017 |
| CN | 107657983 A | 2/2018 |
| CN | 107705762 | 2/2018 |
| CN | 108281123 A | 7/2018 |

OTHER PUBLICATIONS

Chinese Office Action in corresponding Chinese Application No. 201810276380.X dated Apr. 15, 2019 (an English translation attached hereto). 17 pages.

Chinese Office Action in corresponding to Chinese Application No. 201911252572.8 dated Feb. 19, 2021; 10 pages.

* cited by examiner

SHIFT REGISTER UNIT, GATE DRIVING CIRCUIT, DISPLAY DEVICE AND DRIVING METHOD TO REDUCE NOISE

The present application is a U.S. National Stage Application under 35 U.S.C. § 371 of International Patent Application No. PCT/CN2018/113058, filed Oct. 31, 2018, which claims the priority to Chinese patent application No. 201810276380.X, filed on Mar. 30, 2018, both of which are incorporated herein by reference in their entireties as part of the present application.

TECHNICAL FIELD

Embodiments of the present disclosure relate to a shift register unit, a gate driving circuit, a display device and a driving method.

BACKGROUND

In the field of display technology, for example, a pixel array of a liquid crystal display generally includes rows of gate lines and columns of data lines that intersect with each other. Driving of the gate lines can be implemented by an integrated driving circuit amounted on an array substrate. In recent years, with the continuous improvement of an amorphous silicon thin film process, a gate driving circuit can also be directly fabricated on a thin film transistor array substrate to form a GOA (Gate driver On Array) to drive gate lines.

For example, the GOA formed of a plurality of cascaded shift register units can be used to provide switching voltage signals for the rows of gate lines of a pixel array, thereby controlling the rows of gate lines to be turned on sequentially. Data signals are provided by data lines to the pixel units of a corresponding row in the pixel array in each period, thereby forming gray voltages required for displaying each grayscale of an image, and displaying each frame of the image.

SUMMARY

At least one embodiment of the present disclosure provides a shift register unit including an input circuit, a first reset circuit, an output circuit and a node control circuit. The input circuit is configured to control a level of a first node in response to an input signal; the first reset circuit is configured to reset the first node in response to a first reset signal; the output circuit is configured to output a driving signal to an output terminal under control of the level of the first node; and the node control circuit is configured to control a level of a second node in response to the driving signal.

For example, a shift register unit provided by an embodiment of the present disclosure further includes a node noise reduction circuit and a first output noise reduction circuit. The node noise reduction circuit is configured to reduce noise on the first node under control of the level of the second node; and the first output noise reduction circuit is configured to reduce noise on the output terminal under control of the level of the second node.

For example, in a shift register unit provided by an embodiment of the present disclosure, the node control circuit includes a first transistor, a second transistor and a third transistor. A gate electrode of the first transistor and a first electrode of the first transistor are connected to a clock signal terminal to receive a clock signal and the clock signal is used as the driving signal, and a second electrode of the first transistor is connected to the second node; a gate electrode of the second transistor is connected to the first node, a first electrode of the second transistor is connected to the second node, and a second electrode of the second transistor is connected to a first voltage terminal to receive a first voltage; and a gate electrode of the third transistor and a first electrode of the third transistor are connected to the second node, and a second electrode of the third transistor is connected with the clock signal terminal.

For example, in a shift register unit provided by an embodiment of the present disclosure, the node control circuit includes a first transistor, a second transistor, a third transistor and a fourth transistor. A gate electrode of the first transistor and a first electrode of the first transistor are connected to a clock signal terminal to receive a clock signal and the clock signal is used as the driving signal, and a second electrode of the first transistor is connected to a third node; a gate electrode of the second transistor is connected to the first node, a first electrode of the second transistor is connected to the third node, and a second electrode of the second transistor is connected to a first voltage terminal to receive a first voltage; a gate electrode of the third transistor is connected to the third node, a first electrode of the third transistor is connected to the clock signal terminal to receive the clock signal and the clock signal is used as the driving signal, and a second electrode of the third transistor is connected to the second node; and a gate electrode of the fourth transistor is connected to the first node, a first electrode of the fourth transistor is connected to the second node, and a second electrode of the fourth transistor is connected to the first voltage terminal to receive the first voltage.

For example, in a shift register unit provided by an embodiment of the present disclosure, the input circuit includes a fifth transistor. A gate electrode of the fifth transistor is connected to an input terminal to receive the input signal, a first electrode of the fifth transistor is connected to a second voltage terminal to receive a second voltage, and a second electrode of the fifth transistor is connected to the first node.

For example, in a shift register unit provided by an embodiment of the present disclosure, the first reset circuit includes a sixth transistor. A gate electrode of the sixth transistor is connected to a first reset terminal to receive the first reset signal, a first electrode of the sixth transistor is connected to a third voltage terminal to receive a third voltage, and a second electrode of the sixth transistor is connected to the first node.

For example, in a shift register unit provided by an embodiment of the present disclosure, the output circuit includes a seventh transistor and a storage capacitor. A gate electrode of the seventh transistor is connected to the first node, a first electrode of the seventh transistor is connected to a clock signal terminal to receive a clock signal and the clock signal is used as the driving signal, and a second electrode of the seventh transistor is connected to the output terminal; and a first electrode of the storage capacitor is connected to the first node, and a second electrode of the storage capacitor is connected to the output terminal.

For example, in a shift register unit provided by an embodiment of the present disclosure, the node noise reduction circuit includes an eighth transistor. A gate electrode of the eighth transistor is connected to the second node, a first electrode of the eighth transistor is connected to the first node, and a second electrode of the eighth transistor is connected to a first voltage terminal to receive a first voltage.

For example, in a shift register unit provided by an embodiment of the present disclosure, the first output noise reduction circuit includes a ninth transistor. A gate electrode of the ninth transistor is connected to the second node, a first electrode of the ninth transistor is connected to the output terminal, and a second electrode of the ninth transistor is connected to a first voltage terminal to receive a first voltage.

For example, in a shift register unit provided by an embodiment of the present disclosure, a first control node is provided in a path where the input circuit controls the level of the first node, and the input circuit is further configured to control a level of the first control node.

For example, in a shift register unit provided by an embodiment of the present disclosure, the input circuit is configured to connect the first control node to a first voltage terminal under control of the level of the second node.

For example, in a shift register unit provided by an embodiment of the present disclosure, the input circuit includes a fifth transistor, a tenth transistor and an eleventh transistor. A gate electrode of the fifth transistor is connected to an input terminal to receive the input signal, a first electrode of the fifth transistor is connected to a second voltage terminal to receive a second voltage, and a second electrode of the fifth transistor is connected to the first control node; a gate electrode of the tenth transistor is connected to the input terminal to receive the input signal, a first electrode of the tenth transistor is connected to the first control node, and a second electrode of the tenth transistor is connected to the first node; and a gate electrode of the eleventh transistor is connected to the second node, a first electrode of the eleventh transistor is connected to the first control node, and a second electrode of the eleventh transistor is connected to the first voltage terminal.

For example, in a shift register unit provided by an embodiment of the present disclosure, the input circuit is configured to connect the first control node to an input terminal under control of a level of the first control node, and the input terminal is configured to receive the input signal.

For example, in a shift register unit provided by an embodiment of the present disclosure, the input circuit includes a fifth transistor, a tenth transistor and an eleventh transistor. A gate electrode of the fifth transistor is connected to the input terminal to receive the input signal, a first electrode of the fifth transistor is connected to a second voltage terminal to receive a second voltage, and a second electrode of the fifth transistor is connected to the first control node; a gate electrode of the tenth transistor is connected to the input terminal to receive the input signal, a first electrode of the tenth transistor is connected to the first control node, and a second electrode of the tenth transistor is connected to the first node; and a gate electrode of the eleventh transistor and a first electrode of the eleventh transistor are connected to the first control node, and a second electrode of the eleventh transistor is connected to the input terminal.

For example, in a shift register unit provided by an embodiment of the present disclosure, the first reset circuit and the input circuit are symmetrically configured to allow bidirectional scanning.

For example, a shift register unit provided by an embodiment of the present disclosure further includes a second reset circuit and a second output noise reduction circuit. The second reset circuit is configured to reset the first node in response to a second reset signal; and the second output noise reduction circuit is configured to reduce noise on the output terminal in response to the second reset signal.

For example, in a shift register unit provided by an embodiment of the present disclosure, the second reset circuit includes a fourteenth transistor; a gate electrode of the fourteenth transistor is connected to a second reset terminal to receive the second reset signal, a first electrode of the fourteenth transistor is connected to the first node, and a second electrode of the fourteenth transistor is connected to a first voltage terminal to receive a first voltage. The second output noise reduction circuit includes a fifteenth transistor; a gate electrode of the fifteenth transistor is connected to the second reset terminal to receive the second reset signal, a first electrode of the fifteenth transistor is connected to the output terminal, and a second electrode of the fifteenth transistor is connected to the first voltage terminal to receive the first voltage.

At least one embodiment of the present disclosure further provides a gate driving circuit including a plurality of cascaded shift register units each of which is provided by the embodiment of the present disclosure.

At least one embodiment of the present disclosure further provides a display device including the gate driving circuit which is provided by the embodiment of the present disclosure.

At least one embodiment of the present disclosure further provides a driving method of any one of the shift register units described above, including: causing the node control circuit to control the level of the second node in response to the driving signal.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a display panel technology, in order to realize low cost and narrow bezel, a GOA (Gate driver On Array) technology can be adopted, i.e. a gate driving circuit is integrated on the display panel by a thin film transistor manufacturing process, thereby realizing advantages such as narrow bezel, reducing assembly cost and the like. The display panel can be a liquid crystal display (LCD) panel or an organic light emitting diode (OLED) display panel.

Figure 1:
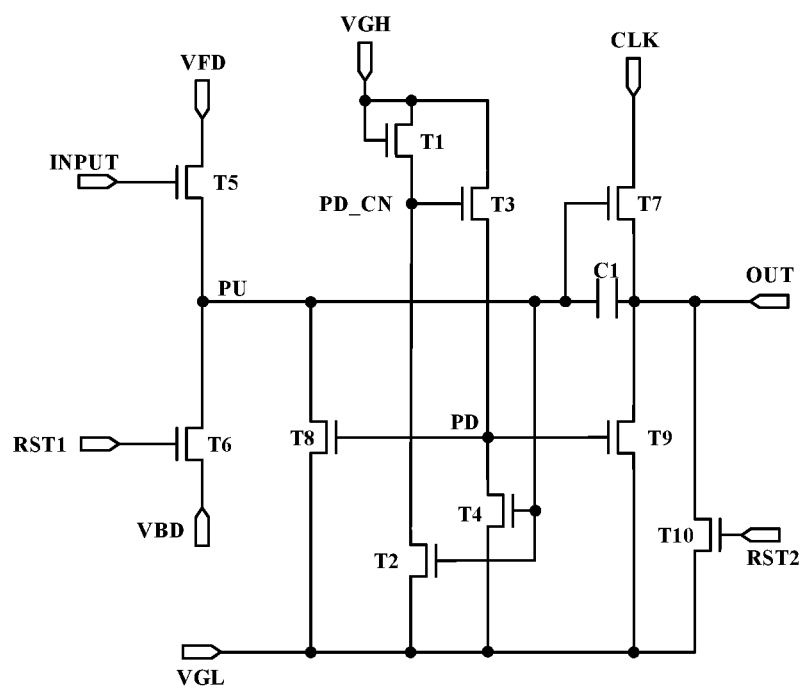
FIG. 1 is a circuit diagram of a shift register unit.

FIG. 1 shows a circuit structure of a shift register unit, and a plurality of the shift register units can be cascaded to form a gate driving circuit. As shown in FIG. 1, the shift register unit includes ten transistors (T1 to T10) and a storage capacitor (C1).

A gate electrode of a first transistor T1 and a first electrode of the first transistor T1 are connected to a fourth voltage terminal VGH (for example, keeping inputting a direct current (DC) high-level signal), and a second electrode of the first transistor T1 is connected to a third node PD_CN.

A gate electrode of a second transistor T2 is connected to a first node PU, a first electrode of the second transistor T2 is connected to the third node PD_CN, and a second electrode of the second transistor T2 is connected to a first voltage terminal VGL (for example, keeping inputting a DC low-level signal).

A gate electrode of a third transistor T3 is connected to the third node PD_CN, a first electrode of the third transistor T3 is connected to the fourth voltage terminal VGH, and a second electrode of the third transistor T3 is connected to a second node PD.

A gate electrode of a fourth transistor T4 is connected to the first node PU, a first electrode of the fourth transistor T4 is connected to the second node PD, and a second electrode of the fourth transistor T4 is connected to the first voltage terminal VGL.

A gate electrode of a fifth transistor T5 is connected to an input terminal INPUT, a first electrode of the fifth transistor T5 is connected to a second voltage terminal VFD, and a second electrode of the fifth transistor T5 is connected to the first node PU.

A gate electrode of a sixth transistor T6 is connected to a first reset terminal RST1, a first electrode of the sixth transistor T6 is connected to the first node PU, and a second electrode of the sixth transistor T6 is connected to a third voltage terminal VBD.

A gate electrode of a seventh transistor T7 is connected to the first node PU, a first electrode of the seventh transistor T7 is connected to a clock signal terminal CLK, and a second electrode of the seventh transistor T7 is connected to an output terminal OUT.

A gate electrode of an eighth transistor T8 is connected to the second node PD, a first electrode of the eighth transistor T8 is connected to the first node PU, and a second electrode of the eighth transistor T8 is connected to the first voltage terminal VGL.

A gate electrode of a ninth transistor T9 is connected to the second node PD, a first electrode of the ninth transistor T9 is connected to the output terminal OUT, and a second electrode of the ninth transistor T9 is connected to the first voltage terminal VGL.

A gate electrode of a tenth transistor T10 is connected to a second reset terminal RST2, a first electrode of the tenth transistor T10 is connected to the output terminal OUT, and a second electrode of the tenth transistor T10 is connected to the first voltage terminal VGL.

A first electrode of the storage capacitor C1 is connected to the first node PU, and a second electrode of the storage capacitor C1 is connected to the output terminal OUT.

For example, the above-mentioned transistors are all N-type transistors. The following description is also made by taking N-type transistors as an example, but embodiments of the present disclosure are not limited to this case, for example, at least some of these transistors can be replaced with a P-type transistor of P-type transistors.

The shift register unit as shown in FIG. 1 can realize bidirectional scanning, for example, in a case where the second voltage terminal VFD keeps inputting a DC high-level signal and the third voltage terminal VBD keeps inputting a DC low-level signal, a forward scanning can be realized. In a case where the second voltage terminal VFD keeps inputting the DC low-level signal and the third voltage terminal VBD keeps inputting the DC high-level signal, a backward scanning can be realized. It should be noted that the forward scanning and the backward scanning in this disclosure are relative.

Figure 2:
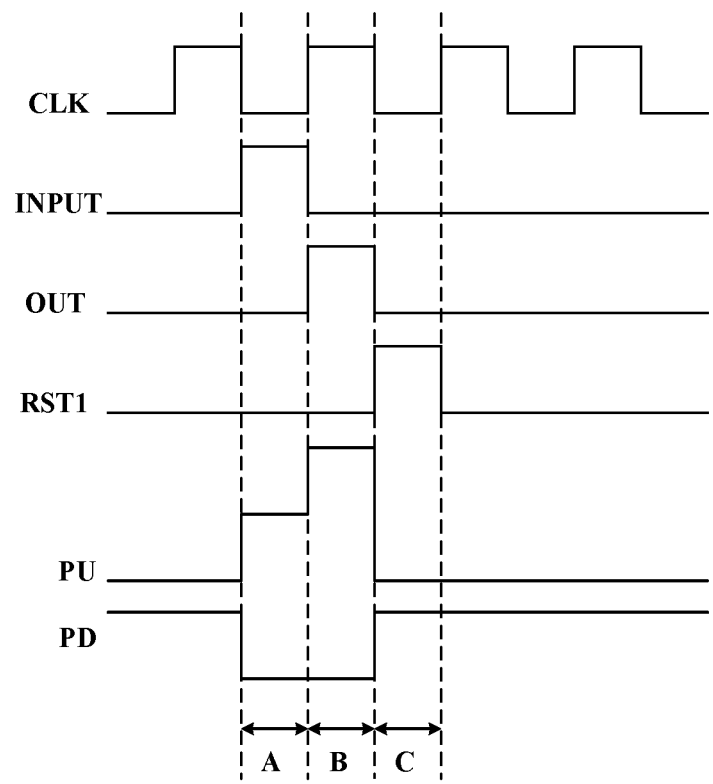
FIG. 2 is a signal timing diagram corresponding to an operation process of the shift register unit as shown in FIG. 1.

The operation principle of the shift register unit as shown in FIG. 1 is described below in combination with a signal timing diagram as shown in FIG. 2, taking the forward scanning as an example, in three stages including an input stage A, an output stage B and a reset stage C as shown in FIG. 2, the shift register unit performs the following operations.

In the input stage A, the clock signal terminal CLK is input with a low-level signal, and the input terminal INPUT is input with a high-level signal. Because the input terminal INPUT is input a high-level signal, the fifth transistor T5 is turned on, the high-level signal inputted by the input terminal INPUT charges the storage capacitor C1, and a potential of the first node PU is pulled up to a first high level.

For example, the fourth voltage terminal VGH can be set to keep inputting the DC high-level signal, the first transistor T1 remains in a turn-on state, and the high-level signal inputted by the fourth voltage terminal VGH controls a potential of the third node PD_CN, for example, charges the third node PD_CN. Because the potential of the first node PU is at the first high level, the second transistor T2 is turned on, thereby causing the third node PD_CN to be electrically connected to the first voltage terminal VGL. In the above case, for example, the first voltage terminal VGL can be set to keep inputting the DC low-level signal. In a design of the transistors, the first transistor T1 and the second transistor T2 can be configured (e.g., size ratios, threshold voltages and the like of the first transistor T1 and the second transistor T2) when both transistors T1 and T2 are turned on, the potential of the third node PD_CN is pulled down to a lower level, which does not cause the third transistor T3 to be fully turned on. Because the potential of the first node PU is at the first high level, the fourth transistor T4 is turned on, causing a potential of the second node PD to be pulled down to a low level. It should be noted that the potential level of the signal timing diagram as shown in FIG. 2 is only schematic and does not represent a real potential value.

Because the first node PU is at the first high level, the seventh transistor T7 is turned on. The clock signal terminal CLK is input with a low-level signal at this time, so that in this stage, the output terminal OUT outputs the low-level signal.

In the output stage B, the clock signal terminal CLK is input with a high-level signal, and the input terminal INPUT is input with a low-level signal. Because the input terminal INPUT is input with the low-level signal, the fifth transistor T5 is turned off, and the first node PU maintains the first high level in the previous stage, thereby causing the seventh transistor T7 to be kept in a turn-on state. Because the clock signal terminal CLK is input with the high-level signal in this stage, the output terminal OUT outputs the high-level signal.

Meanwhile, because the clock signal terminal CLK and the output terminal OUT are at a high level, the high level can raise, by coupling, the potential of the first node PU to a second high level through a parasitic capacitance of the seventh transistor T7 (including a parasitic capacitance between the gate electrode of the seventh transistor T7 and the first electrode of the seventh transistor T7, and a parasitic capacitance between the gate electrode of the seventh transistor T7 and the second electrode of the seventh transistor T7) and the storage capacitance C1, which causing the seventh transistor T7 to be fully turned on. Because the potential of the first node PU is at a high level, the second transistor T2 and the fourth transistor T4 continue to be turned on, which causing the potential of the second node PD continues to remain at a low level.

In the reset stage C, because the first reset terminal RST1 is input with a high-level signal, the sixth transistor T6 is turned on, the first node PU is electrically connected to the third voltage terminal VBD, and the potential of the first node PU is pulled down to a low level, so that the seventh transistor T7 is turned off.

Because the potential of the first node PU is at a low level, the second transistor T2 and the fourth transistor T4 are turned off, the discharging paths of the third node PD_CN and the second node PD are turned off, and the potential of the second node PD is pulled up to a high level, thereby causing the eighth transistor T8 and the ninth transistor T9 to be turned on, respectively pulling the potentials of the first node PU and the output terminal OUT down to the low level input by the first voltage terminal VGL, further eliminating noises which may be generated at the output terminal and the first node PU of the shift register unit during a non-output stage.

When the shift register unit is in operation, in the input stage A, the potential of the third node PD_CN may not completely turn off the third transistor T3. In this case, the high-level signal of the fourth voltage terminal VGH will pull up the level of the second node PD, thereby causing the eighth transistor T8 to be turned on partially, which will affect the charging process of the first node PU, and in a serious case, may affect the normal output of the output terminal OUT. In the reset stage C and the subsequent stages, because the second node PD is always kept at a high level, the eighth transistor T8 and the ninth transistor T9 are subjected to stress for most of the time displayed in one frame, which affects the lifetime of the eighth transistor T8 and the ninth transistor T9.

In addition, when the above-mentioned shift register unit is in the forward scanning, the second voltage terminal VFD maintains inputting the DC high-level signal, and the fifth transistor T5 may be negatively shifted by the threshold voltage due to negative bias thermal stress, NBTS) for a long time. At this time, if the shift register unit is switched to the backward scanning and the fifth transistor T5 becomes a reset transistor, then the level of the first node PU may be leaked through the fifth transistor T5 during the input stage, thereby causing the level of the first node PU unable to be maintained, which may affect the normal output of the output terminal OUT in a serious case.

At least one embodiment of the present disclosure provides a shift register unit including an input circuit, a first reset circuit, an output circuit and a node control circuit. The input circuit is configured to control a level of a first node in response to an input signal; the first reset circuit is configured to reset the first node in response to a first reset signal; the output circuit is configured to output a driving signal to an output terminal under control of the level of the first node; and the node control circuit is configured to control a level of a second node in response to the driving signal.

At least one embodiment of the present disclosure further provides a gate driving circuit, a display device and a driving method corresponding to the above-described shift register unit.

The shift register unit, the gate drive circuit, the display device and the driving method provided by the embodiments of the present disclosure can control the level of the second node PD by the node control circuit so as to cause the second node PD to be at a low level during the input stage, thereby reducing the influence of the second node PD on the first node PU and enabling the first node PU to be pulled up to a higher level during the input stage; in addition, the level of the second node PD can be kept at a low level for about 50% of the time in one display frame, thereby prolonging the service life of the transistors directly connected with the second node PD.

Embodiments of the present disclosure and examples thereof will be described in detail below with reference to the accompanying drawings.

Figure 3:
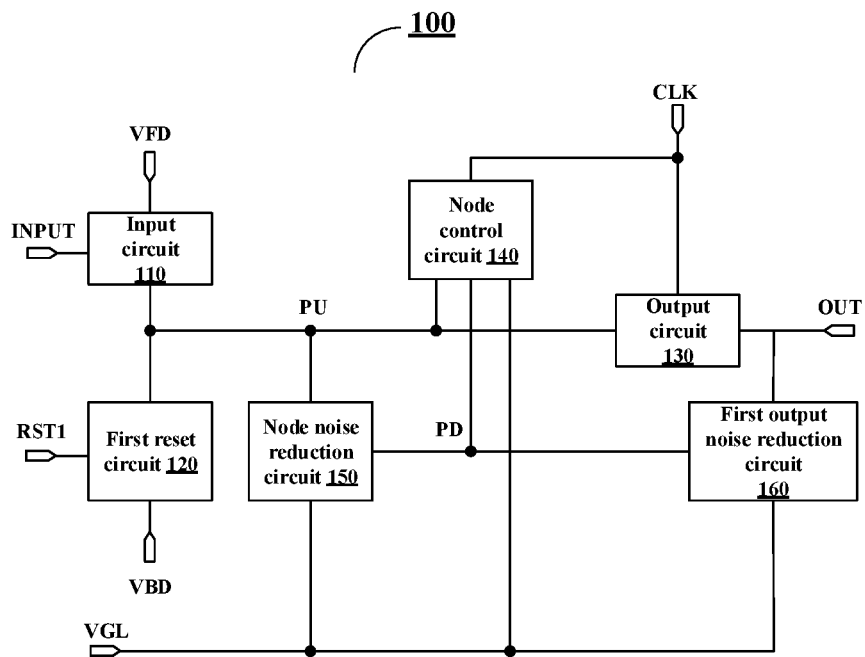
FIG. 3 is a schematic block diagram of a shift register unit provided by an embodiment of the present disclosure.

An example of an embodiment of the present disclosure provides a shift register unit 100, as shown in FIG. 3, the shift register unit 100 includes an input circuit 110, a first reset circuit 120, an output circuit 130 and a node control circuit 140.

The input circuit 110 is configured to control a level of a first node PU in response to an input signal, for example, to charge the first node PU. For example, the input circuit 110 is configured to cause the first node PU to be electrically connected to the second voltage terminal VFD, so that the first node PU can be charged with a high-level signal inputted by the second voltage terminal VFD. It should be noted that, for example, the second voltage terminal VFD can be configured to keep inputting a DC high-level signal. The following embodiments are the same as the above and will not be described again.

It should be noted that in the embodiments of the present disclosure, controlling a level of a node (e.g., the first node PU, the second node PD, the third node PD_CN, etc.) including charging the node to pull up the level of the node, or discharging the node to pull down the level of the node. Charging a node means, for example, electrically connecting the node with a high-level voltage signal, thereby using the high-level voltage signal to pull up the level of the node; discharging the node means, for example, electrically connecting the node to a low-level voltage signal, thereby using the low-level voltage signal to pull down the level of the node. For example, a capacitor can be set to be electrically connected to the node, and charging or discharging the node means charging or discharging the capacitor electrically connected to the node.

The first reset circuit 120 is configured to reset the first node PU in response to a first reset signal. For example, the first reset circuit 120 is configured to be connected to a first reset terminal RST1, so that the first node PU can be electrically connected to a low-level signal or a low voltage terminal, such as a third voltage terminal VBD, under control of the first reset signal inputted by the first reset terminal RST1, thereby resetting the first node PU. It should be noted that the third voltage terminal VBD can be configured to keep inputting the DC low-level signal, for example, and the following embodiments are the same as the above and will not be described again.

The output circuit 130 is configured to output a driving signal to an output terminal OUT under control of the level of the first node PU. For example, the output circuit 130 is configured to electrically connect a clock signal terminal CLK and the output terminal OUT under control of the level of the first node PU, so that the clock signal inputted by the clock signal terminal CLK can be output to the output terminal OUT as the driving signal.

The node control circuit 140 is configured to control a level of a second node PD in response to the driving signal. For example, the node control circuit 140 is connected to the clock signal terminal CLK, and takes the clock signal inputted by the clock signal terminal CLK as a driving signal, so that when the clock signal inputted by the clock signal terminal CLK is at a low level (for example, during the input stage), the second node PD can discharge through the clock signal terminal CLK; for another example, in the subsequent stages after the reset stage in one display frame, the potential of the second node PD may remain to follow the change of the clock signal, so that the potential of the second node PD remains at a low level for about 50% of the time in one display frame.

In the shift register unit 100 provided by the embodiment of the present disclosure, by setting the node control circuit 140 connected to the clock signal terminal CLK, the potential of the second node PD can be kept at a low level in the input stage, thereby reducing the influence of the second node PD on the first node PU, so that the first node PU can be pulled up to a higher level in the input stage; in addition, the potential of the second node PD can be kept at a low level for about 50% of the time in one display frame, thereby prolonging the service life of the transistors directly connected with the second node PD.

For example, as shown in FIG. 3, in another example of this embodiment, the shift register unit 100 further includes a node noise reduction circuit 150 and a first output noise reduction circuit 160.

The node noise reduction circuit 150 is configured to reduce noise on the first node PU under control of the level of the second node PD. For example, the node noise reduction circuit 150 is connected to the first voltage terminal VGL to electrically connect the first node PU and the first voltage terminal VGL under control of the level of the second node PD, thereby reducing noise on the first node PU. It should be noted that, for example, the first voltage terminal VGL can be configured to keep inputting the DC low-level signal. The following embodiments are the same as the above and will not be described again.

The first output noise reduction circuit 160 is configured to reduce noise on the output terminal OUT under control of the level of the second node PD. For example, the first output noise reduction circuit 160 electrically connects the output terminal OUT and the first voltage terminal VGL under control of the level of the second node PD, thereby reducing noise on the output terminal OUT.

Figure 4:
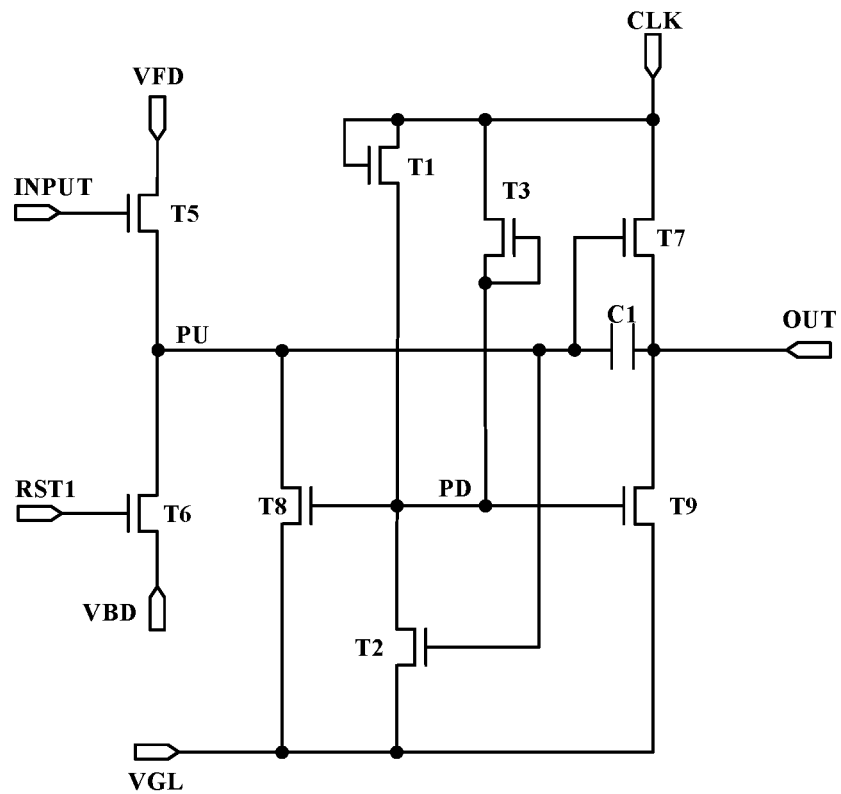
FIG. 4 is a circuit diagram showing an implementation example of the shift register unit as shown in FIG. 3.
Figure 5:
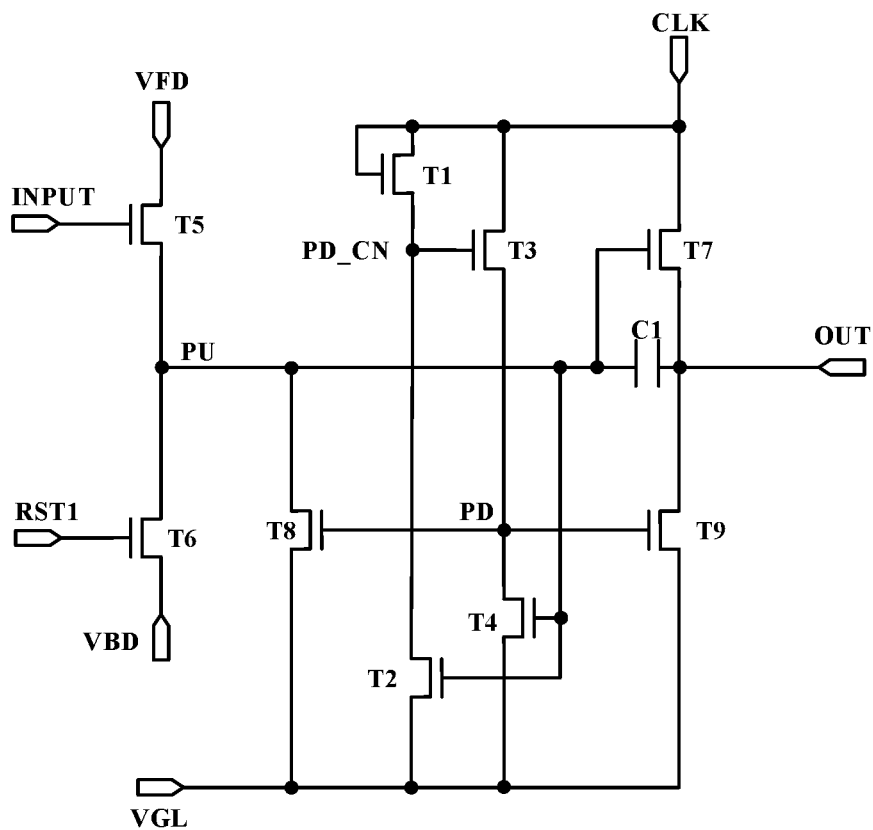
FIG. 5 is a circuit diagram showing another implementation example of the shift register unit as shown in FIG. 3.

For example, the shift register unit 100 as shown in FIG. 3 can be implemented as the circuit structures as shown in FIG. 4 and FIG. 5.

As shown in FIG. 4, in an example, the node control circuit 140 can be implemented to include a first transistor T1, a second transistor T2, and a third transistor T3. A gate electrode of the first transistor T1 and a first electrode of the first transistor T1 are connected to the clock signal terminal CLK to receive the clock signal and the clock signal is used as the driving signal, and a second electrode of the first transistor T1 is connected to the second node PD; a gate electrode of the second transistor T2 is connected to the first node PU, a first electrode of the second transistor T2 is connected to the second node PD, and a second electrode of the second transistor T2 is connected to the first voltage terminal VGL to receive a first voltage; a gate electrode of the third transistor T3 and a first electrode of the third transistor T3 are connected to the second node PD, and a second electrode of the third transistor T3 is connected to the clock signal terminal CLK.

In the example as shown in FIG. 4, for example, during the input stage, the clock signal terminal CLK is input with a low-level clock signal, the first transistor T1 is turned off, and because the third transistor T3 adopts a diode connection mode, the second node PD can be discharged to a low level through the third transistor T3 and the clock signal terminal CLK, thereby reducing the influence of the second node PD on the first node PU, so that the first node PU can be pulled up to a higher level during the input stage. In addition, because the second node PD is no longer discharged only through the second transistor T2, the second transistor T2 can have a larger threshold voltage offset design margin, thereby reducing the process difficulty.

For another example, in the subsequent stages after the reset stage, when the clock signal terminal CLK is input with a high-level clock signal, the clock signal can charge the second node PD through the first transistor T1, thereby making the potential of the second node PD to be a high level; when the clock signal terminal CLK is input with a low-level clock signal, the second node PD can be discharged to a low level through the third transistor T3 and the clock signal terminal CLK. That is to say, in the subsequent stages after the reset stage, the potential of the second node PD can follow the change of the clock signal, so that the potential of the second node PD remains at a low level for about 50% of the time in one display frame, thereby enabling transistors directly connected to the second node PD (e.g., the eighth transistor T8 and the ninth transistor T9) to be unstressed for about 50% of the time in one display frame, and further prolonging the service life of transistors directly connected to the second node PD.

As shown in FIG. 5, in another example, the node control circuit 140 can be implemented to include a first transistor T1, a second transistor T2, a third transistor T3, and a fourth transistor T4. A gate electrode of the first transistor T1 and a first electrode of the first transistor T1 are connected to the clock signal terminal CLK to receive the clock signal and the clock signal is used as the driving signal, and a second electrode of the first transistor T1 is connected to the third node PD_CN; a gate electrode of the second transistor T2 is connected to the first node PU, a first electrode of the second transistor T2 is connected to the third node PD_CN, and a second electrode of the second transistor T2 is connected to the first voltage terminal VGL to receive the first voltage; a gate electrode of the third transistor T3 is connected to the third node PD_CN, a first electrode of the third transistor T3 is connected to the clock signal terminal CLK to receive the clock signal, and a second electrode of the third transistor T3 is connected to the second node PD; a gate electrode of the fourth transistor T4 is connected to the first node PU, a first electrode of the fourth transistor T4 is connected to the second node PD, and a second electrode of the fourth transistor T4 is connected to the first voltage terminal VGL to receive the first voltage.

In the example shown in FIG. 5, for example, in a stage before the input stage, the clock signal terminal CLK is input with a high-level clock signal, and the clock signal can charge the third node PD_CN through the first transistor T1, so that the potential of the third node PD_CN becomes a high level. Subsequently, at the beginning of the input stage, the clock signal terminal CLK is input with a low-level clock signal, and because the third node PD_CN can maintain the high level of the previous stage, the third transistor T3 is turned on, and the second node PD can discharge to a low level through the third transistor T3 and the clock signal terminal CLK, thereby not affecting the charging process of the input circuit 110 to the first node PU, and enabling the charging of the first node PU to be more sufficient. In addition, because the second node PD is no longer discharged only through the fourth transistor T4, the fourth transistor T4 can have a larger threshold voltage offset design margin, thereby reducing the process difficulty.

For another example, in the subsequent stages after the reset stage, because the first node PU remains at a low level, the second transistor T2 and the fourth transistor T4 remain in a turn-off state. When the clock signal terminal CLK is input with a high-level clock signal, the clock signal can charge the third node PD_CN through the first transistor T1, so that the potential of the third node PD_CN becomes to be a high level, the third transistor T3 is turned on, and the clock signal can charge the second node PD through the third transistor T3, so that the potential of the second node PD becomes to be a high level; when the clock signal terminal CLK is input with a low-level clock signal, because the third node PD_CN can remain at a high level, the third transistor T3 remains in a turn-on state, and the second node PD can be discharged to a low level through the third transistor T3 and the clock signal terminal CLK. That is to say, in the subsequent stages after the reset stage, the potential of the second node PD can follow the change of the clock signal, so that the potential of the second node PD remains at a low level for about 50% of the time in one display frame, thereby enabling transistors directly connected to the second node PD (e.g., the eighth transistor T8 and the ninth transistor T9) to be unstressed for about 50% of the time in one display frame, and further prolonging the service life of transistors directly connected to the second node PD.

In the examples as shown in FIG. 4 and FIG. 5, the input circuit 110 can be implemented as a fifth transistor T5. A gate electrode of the fifth transistor T5 is connected to the input terminal INPUT to receive an input signal, a first electrode of the fifth transistor T5 is connected to the second voltage terminal VFD to receive a second voltage, and a second electrode of the fifth transistor T5 is connected to the first node PU.

In the examples as shown in FIG. 4 and FIG. 5, the first reset circuit 120 can be implemented as a sixth transistor T6. A gate electrode of the sixth transistor T6 is connected to a first reset terminal RST1 to receive the first reset signal, a first electrode of the sixth transistor T6 is connected to a third voltage terminal VBD to receive a third voltage, and a second electrode of the sixth transistor T6 is connected to the first node PU.

In the above examples, it can be considered that the first reset circuit 120 and the input circuit 110 are symmetrically arranged, so that the shift register unit 100 can be used for a bidirectional scanning. In a case where a gate driving circuit adopting the shift register unit 100 is used to drive a display panel to perform a forward scanning, the input signal is provided through the input terminal INPUT, and the first reset signal is provided through the first reset terminal RST1. However, in a case where the gate driving circuit adopting the shift register unit 100 is used to drive a display panel to perform a backward scanning, the input signal needs to be provided through the first reset terminal RST1, and the first reset signal needs to be provided through the input terminal INPUT.

In the examples as shown in FIG. 4 and FIG. 5, the output circuit 130 can be implemented to include a seventh transistor T7 and a storage capacitor C1. A gate electrode of the seventh transistor T7 is connected to the first node PU, a first electrode of the seventh transistor T7 is connected to the clock signal terminal CLK to receive the clock signal and the clock signal is used as the driving signal, and a second electrode of the seventh transistor T7 is connected to the output terminal OUT; a first electrode of the storage capacitor C1 is connected to the first node PU, and a second electrode of the storage capacitor C1 is connected to the output terminal OUT.

In the examples as shown in FIG. 4 and FIG. 5, the node noise reduction circuit 150 can be implemented as an eighth transistor T8. A gate electrode of the eighth transistor T8 is connected to the second node PD, a first electrode of the eighth transistor T8 is connected to the first node PU, and a second electrode of the eighth transistor T8 is connected to the first voltage terminal VGL to receive the first voltage.

In the examples as shown in FIG. 4 and FIG. 5, the first output noise reduction circuit 160 can be implemented as a ninth transistor T9. A gate electrode of the ninth transistor T9 is connected to the second node PD, a first electrode of the ninth transistor T9 is connected to the output terminal OUT, and a second electrode of the ninth transistor T9 is connected to the first voltage terminal VGL to receive the first voltage.

It should be noted that in the shift register unit 100 provided by the embodiment of the present disclosure, the level of the signal received by the first voltage terminal VGL is referred to as the first voltage, for example, keeping inputting a DC low-level signal. The level of the signal received by the second voltage terminal VFD is referred to as the second voltage, for example, in a case where the shift register unit 100 is used for the forward scanning, the second voltage terminal VFD keeps inputting a DC high-level signal, and for another example, in a case where the shift register unit 100 is used for the backward scanning, the second voltage terminal VFD keeps inputting a DC low-level signal. The level of the signal received by the third voltage terminal VBD is referred to as the third voltage. For example, in a case where the shift register unit 100 is used for the forward scanning, the third voltage terminal VBD keeps inputting a DC low-level signal, and for another example, in a case where the shift register unit 100 is used for the backward scanning, the third voltage terminal VBD keeps inputting a DC high-level signal. The following embodiments are the same as above and will not be described again.

In addition, it should be noted that in the embodiments of the present disclosure, the high level and the low level are described relatively. The high level represents a higher voltage range (for example, the high level may adopt 5V, 10V or other suitable voltages), and multiple high levels may be same or different. Similarly, the low level represents a lower voltage range (for example, a low level may adopt 0V, −5V, −10V or other suitable voltages), and multiple low levels may be same or different. For example, the minimum value of the high level is greater than the maximum value of the low level.

Figure 6:
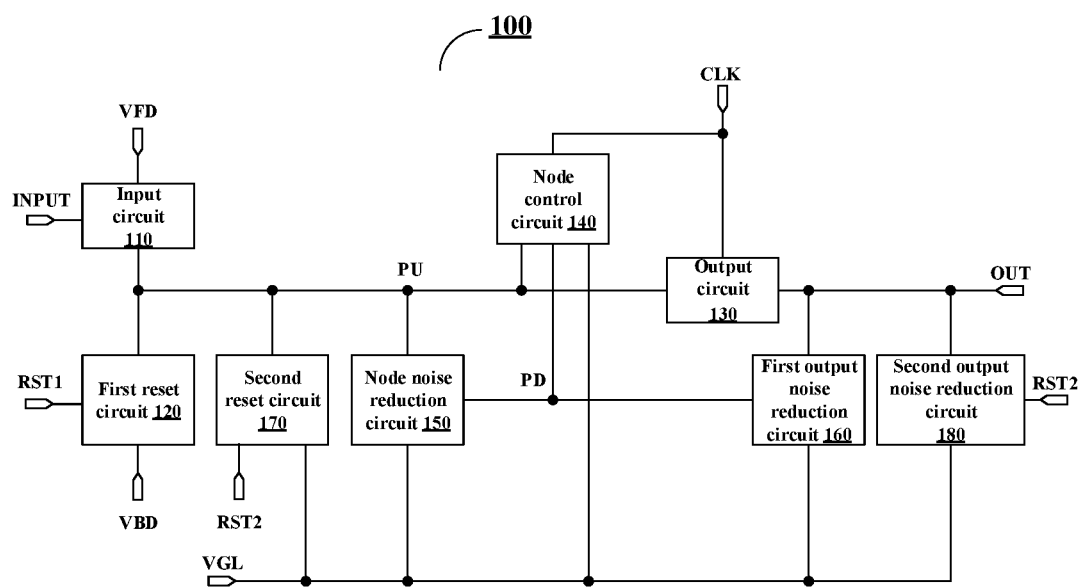
FIG. 6 is a schematic block diagram of another shift register unit provided by an embodiment of the present disclosure.

In the shift register unit 100 provided by the embodiment of the present disclosure, as shown in FIG. 6, the shift register unit 100 further includes a second reset circuit 170 and a second output noise reduction circuit 180.

Figure 10:
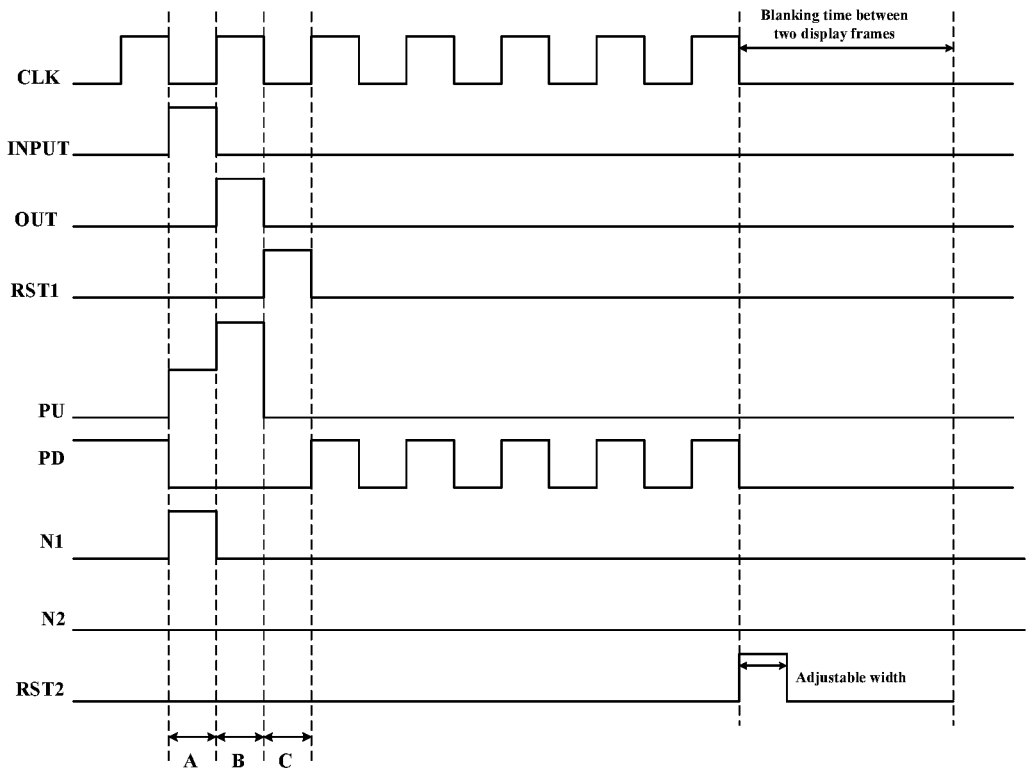
FIG. 10 is a signal timing diagram corresponding to an operation process of the shift register unit as shown in FIG. 9.

The second reset circuit 170 is configured to reset the first node PU in response to a second reset signal. For example, the second reset circuit 170 is configured to be connected to a second reset terminal RST2, so that the first node PU can be electrically connected to a low-level signal or a low voltage terminal, such as the first voltage terminal VGL, under control of the second reset signal inputted by the second reset terminal RST2, thereby resetting the first node PU. For example, referring to the timing diagram as shown in FIG. 10, the second reset signal can be provided at a blanking time between two display frames to simultaneously perform reset operations on the first nodes PU of all shift register units in the gate driving circuit. It should be noted that in the timing diagram as shown in FIG. 10, the second reset signal is provided at a beginning stage of the blanking time, the embodiment of the present disclosure does not limit the specific time stage for providing the second reset signal, for example, the second reset signal can be provided at any other stage of the blanking time. In addition, the pulse width of the second reset signal provided by the second reset terminal RST2 is adjustable. The following embodiments are the same and will not be described again.

The second output noise reduction circuit 180 is configured to reduce noise on the output terminal OUT in response to the second reset signal. For example, the second output noise reduction circuit 180 is configured to be connected to the second reset terminal RST2, so that the output terminal OUT is electrically connected to the first voltage terminal VGL under control of the second reset signal inputted by the second reset terminal RST2, thereby reducing noise on the output terminal OUT. For example, referring to the timing diagram as shown in FIG. 10, the second reset signal can be provided at the blanking time between two display frames to simultaneously denoise the output terminals of all shift register units in the gate driving circuit.

Figure 7:
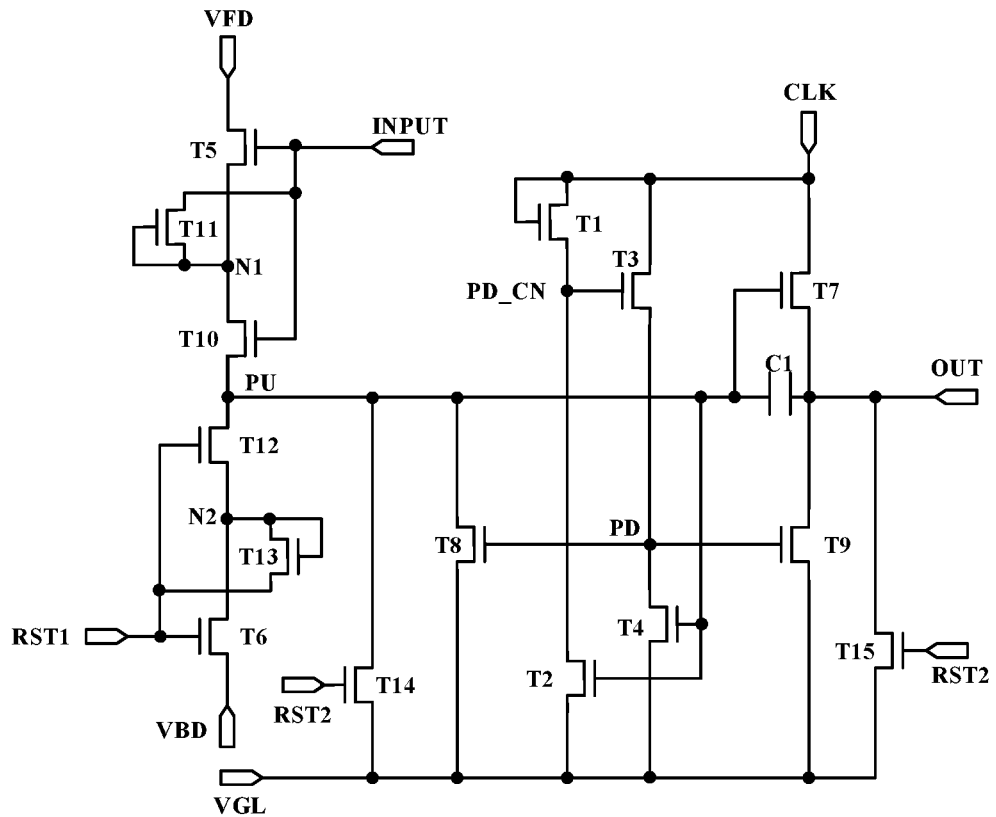
FIG. 7 is a circuit diagram showing an implementation example of the shift register unit as shown in FIG. 6.
Figure 9:
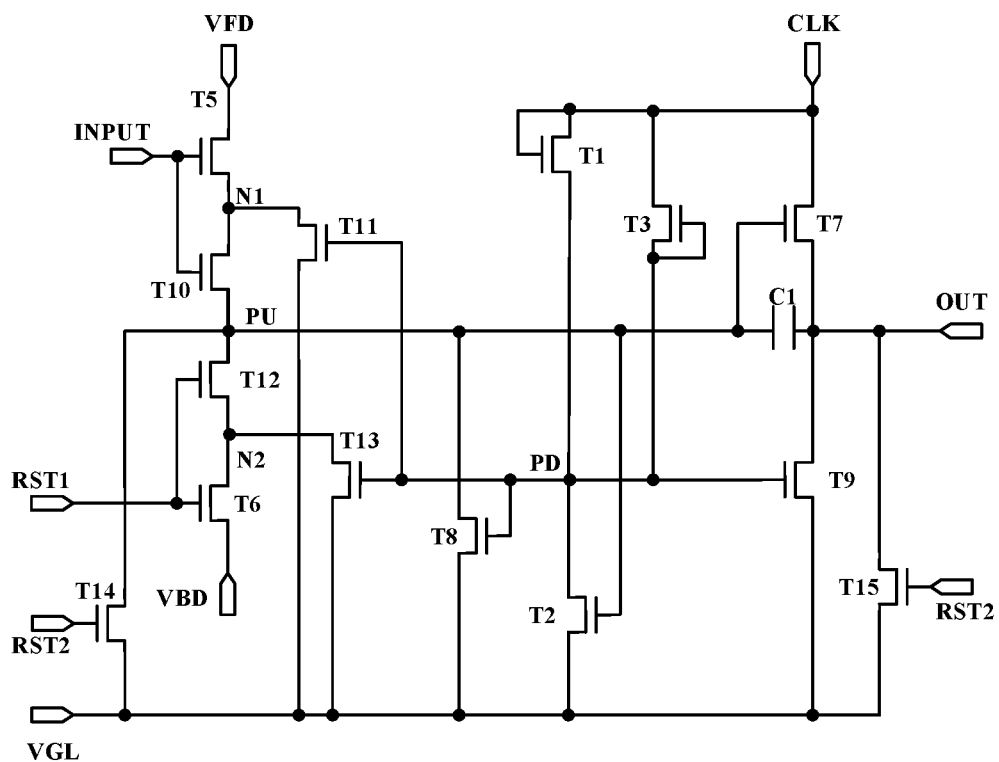
FIG. 9 is a circuit diagram showing an implementation example of the shift register unit as shown in FIG. 8.

For example, in the examples as shown in FIG. 7 and FIG. 9, the second reset circuit 170 can be implemented as a fourteenth transistor T14. A gate electrode of the fourteenth transistor T14 is connected to the second reset terminal RST2 to receive the second reset signal, a first electrode of the fourteenth transistor T14 is connected to the first node PU, and a second electrode of the fourteenth transistor T14 is connected to the first voltage terminal VGL to receive the first voltage.

For example, in the examples as shown in FIG. 7 and FIG. 9, the second output noise reduction circuit 180 can be implemented as a fifteenth transistor T15. A gate electrode of the fifteenth transistor T15 is connected to the second reset terminal RST2 to receive the second reset signal, a first electrode of the fifteenth transistor T15 is connected to the output terminal OUT, and a second electrode of the fifteenth transistor T15 is connected to the first voltage terminal VGL to receive the first voltage.

In the shift register unit 100 provided by one embodiment of the present disclosure, a first control node N1 is provided in a path (e.g., a charging path) where the input circuit 110 controls the level of the first node PU, and the input circuit 110 is further configured to control the level of the first control node N1, e.g., charge or discharge the first control node N1. In this way, the transistors electrically connected to the first control node N1 and the first node PU in the input circuit 110 can maintain a zero bias state, thereby eliminating the risk of negative shift of the threshold voltage, preventing the first node PU from forming a leakage path after switching the scanning direction, preventing the output terminal OUT from not outputting normally, and enhancing the reliability of the circuit.

For example, in the example as shown in FIG. 6, the input circuit 110 is configured to connect the first control node N1 to the input terminal input under control of the level of the first control node N1 (the first control node N1 is not shown in FIG. 6), and the input terminal INPUT is configured to receive the input signal. For example, in a case where the input signal provided by the input terminal INPUT is at a low level, the first control node N1 can discharge through the input terminal INPUT.

For example, in one example, the shift register unit 100 as shown in FIG. 6 can be implemented as the circuit structure as shown in FIG. 7. The input circuit 110 in the shift register unit 100 can be implemented to include a fifth transistor T5, a tenth transistor T10, and an eleventh transistor T11. A gate electrode of the fifth transistor T5 is connected to the input terminal INPUT to receive the input signal, a first electrode of the fifth transistor T5 is connected to the second voltage terminal VFD to receive the second voltage, and a second electrode of the fifth transistor T5 is connected to the first control node N1; a gate electrode of the tenth transistor T10 is connected to the input terminal INPUT to receive the input signal, a first electrode of the tenth transistor T10 is connected to the first control node N1, and a second electrode of the tenth transistor T10 is connected to the first node PU; a gate electrode of the eleventh transistor T11 and a first electrode of the eleventh transistor T11 are connected to the first control node N1, and a second electrode of the eleventh transistor T11 is connected to the input terminal INPUT.

In the example as shown in FIG. 7, for example, in the INPUT stage, the input signal provided by the input terminal INPUT is at a high level, and the fifth transistor T5 and the tenth transistor T10 are both turned on, so that the second voltage inputted by the second voltage terminal VFD charges the first node PU, so that the potential of the first node PU and the potential of the first control node N1 are pulled to a high level. In the output stage, the input signal provided by the input terminal INPUT changes to a low level, and the first control node N1 can be discharged to a low level through the eleventh transistor T11 and the input terminal INPUT. In addition, the potential of the first control node N1 is further decrease due to coupling, for example, due to parasitic capacitance coupling of the transistors. In addition, in a subsequent stage, because the second voltage terminal VFD keeps inputting a high level, the fifth transistor T5 has the risk of negative offset, and the potential of the first control node N1 may be pulled up to a high level. In this case, the first control node N1 can further be discharged to a low level through the eleventh transistor T11 and the input terminal INPUT. In the reset stage, the potential of the first node PU is also pulled down to a low level. In this way, the tenth transistor T10 can remain in a zero bias state for most of the time of one display frame, thereby eliminating the risk of negative shift of threshold voltage, preventing the first node PU from forming a leakage path after switching the scanning direction, preventing the output terminal OUT from not outputting normally, and enhancing the reliability of the circuit.

In the example as shown in FIG. 7, the first reset circuit 120 and the input circuit 110 are symmetrically arranged, so that the shift register unit 100 can be used for the bidirectional scanning. Accordingly, the first reset circuit 120 can be implemented to include a sixth transistor T6, a twelfth transistor T12, and a thirteenth transistor T13. The connection relationship of each transistor of the first reset circuit 120 is shown in FIG. 7, and will not be described here. In a case where the gate driving circuit adopting the shift register unit 100 is used to drive a display panel to perform the forward scanning (i.e., the input signal is input through the input terminal INPUT, and the first reset signal is input through the first reset terminal RST1), its operation is as described above, while in a case where the gate driving circuit adopting the shift register unit 100 is used to drive the display panel to perform the backward scanning (i.e., the input signal is input through the first reset terminal RST1, and the first reset signal is input through the input terminal INPUT), and the second control node N2 can be discharged to a low level through the thirteenth transistor T13 and the first reset terminal RST1, so that the twelfth transistor T12 can remain in a zero bias state for most of the time of one display frame, thereby eliminating the risk of negative shift of the threshold voltage, preventing the first node PU from forming a leakage path after switching the scanning direction, preventing the output terminal OUT from not outputting normally, and enhancing the reliability of the circuit.

It should be noted that the node control circuit 140 in the shift register unit 100 as shown in FIG. 6 can also adopt the node control circuit 140 in the shift register unit 100 as shown in FIG. 4, and the present disclosure is not limited to this.

Figure 8:
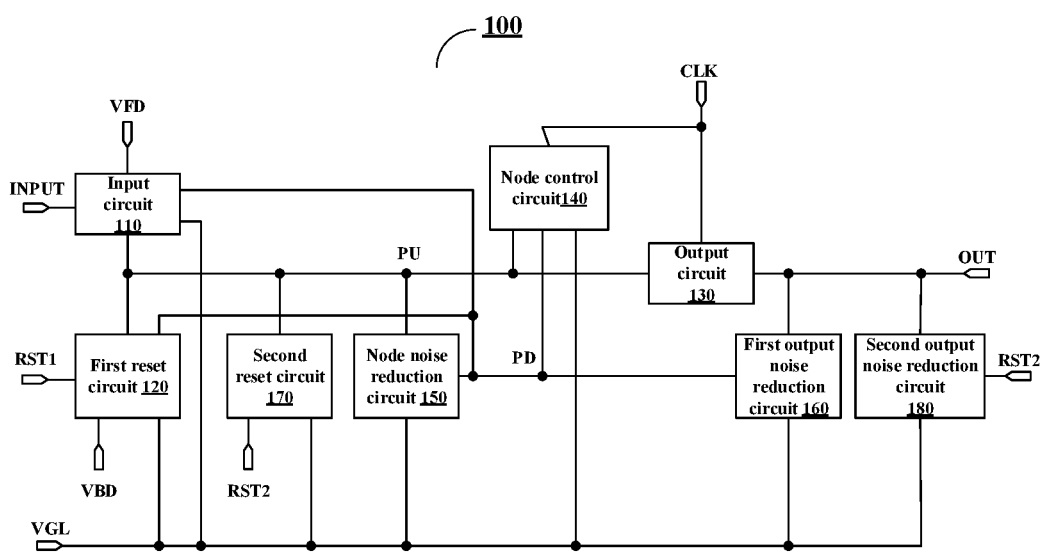
FIG. 8 is a schematic block diagram of yet another shift register unit provided by an embodiment of the present disclosure.

For example, in the example as shown in FIG. 8, the input circuit 110 is configured to connect the first control node N1 to the first voltage terminal VGL under control of the level of the second node PD (the first control node N1 is not shown in FIG. 8). For example, in a case where the second node PD is at a high level, the first control node N1 can discharge through the first voltage terminal VGL.

For example, in one example, the shift register unit 100 as shown in FIG. 8 can be implemented as the circuit structure as shown in FIG. 9. The input circuit 110 in the shift register unit 100 can be implemented to include a fifth transistor T5, a tenth transistor T10, and an eleventh transistor T11. A gate electrode of the fifth transistor T5 is connected to the input terminal INPUT to receive the input signal, a first electrode of the fifth transistor T5 is connected to the second voltage terminal VFD to receive the second voltage, and a second electrode of the fifth transistor T5 is connected to the first control node N1; a gate electrode of the tenth transistor T10 is connected to the input terminal INPUT to receive the input signal, a first electrode of the tenth transistor T10 is connected to the first control node N1, and a second electrode of the tenth transistor T10 is connected to the first node PU; a gate electrode of the eleventh transistor T11 is connected to the second node PD, a first electrode of the eleventh transistor T11 is connected to the first control node N1, and a second electrode of the eleventh transistor T11 is connected to the first voltage terminal VGL.

In the example as shown in FIG. 9, for example, in the input stage, the input signal provided by the input terminal INPUT is at a high level, and the fifth transistor T5 and the tenth transistor T10 are both turned on, so that the second voltage inputted by the second voltage terminal VFD charges the first node PU, so that the potential of the first node PU and the potential of the first control node N1 are pulled up to a high level. In the output stage, the input signal provided by the input terminal INPUT becomes to a low level, the fifth transistor T5 and the tenth transistor T10 are turned off, and the potential of the first control node N1 is reduced to a low level due to coupling, for example, due to parasitic capacitance coupling of the transistors. In the reset stage, the potential of the first node PU is pulled down to a low level. In the subsequent stages after the reset stage, when the potential of the second node PD is at a high level, the eleventh transistor T11 is turned on, so that the first control node N1 can be further discharged. In this way, the tenth transistor T10 can remain in a zero bias state for most of the time of one display frame, thereby eliminating the risk of negative shift of threshold voltage, preventing the first node PU from forming a leakage path after switching the scanning direction, preventing the output terminal OUT from not outputting normally, and enhancing the reliability of the circuit.

In the example as shown in FIG. 9, the first reset circuit 120 and the input circuit 110 are symmetrically arranged, so the shift register unit 100 can be used for the bidirectional scanning. Accordingly, the first reset circuit 120 can be implemented to include a sixth transistor T6, a twelfth transistor T12, and a thirteenth transistor T13. The connection relationship of each transistor of the first reset circuit 120 is shown in FIG. 9, and will not be described here. In a case where the gate driving circuit adopting the shift register unit 100 is used to drive a display panel to perform the forward scanning (i.e., the input signal is input through the input terminal INPUT, and the first reset signal is input through the first reset terminal RST1), its operation is as described above, while in a case where the gate driving circuit adopting the shift register unit 100 is used to drive the display panel to perform the backward scanning (i.e., the input signal is input through the first reset terminal RST1, and the first reset signal is input through the input terminal INPUT), and the second control node N2 can be discharged to a low level through the thirteenth transistor T13, so that the twelfth transistor T12 can remain in a zero bias state for most of the time of one display frame, thereby eliminating the risk of negative shift of the threshold voltage, preventing the first node PU from forming a leakage path after switching the scanning direction, preventing the output terminal OUT from not outputting normally, and enhancing the reliability of the circuit.

It should be noted that the transistors used in the embodiments of the present disclosure can adopt thin film transistors, field-effect transistors or other switching devices with the same characteristics, and the embodiments of the present disclosure are all described with thin film transistors as examples. Source electrodes and drain electrodes of the transistors adopted herein can be symmetrical in structure, so the source electrodes and drain electrodes are not different in structure. In the embodiments of the present disclosure, in order to distinguish between the two electrodes of a transistor other than a gate electrode, it is directly described that one of the two electrodes is a first electrode and the other electrode is a second electrode.

In addition, the transistors in the embodiments of the present disclosure are all described by taking N-type transistors as examples. In this case, the first electrode may be a drain electrode and the second electrode may be a source electrode. It should be noted that the present disclosure includes but is not limited to this. For example, one or more transistors in the shift register unit provided by the embodiments of the present disclosure may also adopt P-type transistors. In this case, the first electrode may be a source electrode and the second electrode may be a drain electrode. For a different type of transistor, each electrode of this transistors need to be correspondingly connected with reference to each electrode of the corresponding transistor employed in examples of the embodiments of the present disclosure.

For example, as shown in FIG. 9, the transistors in the shift register unit 100 are all n-type transistors, the first voltage terminal VGL keeps inputting a DC low-level first voltage, the second voltage terminal VFD keeps inputting a DC high-level second voltage, the third voltage terminal VBD keeps inputting a DC low-level third voltage, and the clock signal terminal CLK is input with the clock signal.

The operation principle of the shift register unit 100 as shown in FIG. 9 will be described below with reference to the signal timing diagram as shown in FIG. 10 (taking the forward scanning as an example). In an input stage A, an output stage B and a reset stage C as shown in FIG. 10, the shift register unit 100 performs the following operations.

In the input stage A, the clock signal terminal CLK is input with a low-level clock signal, and the input terminal INPUT is input with a high-level signal. Because the input terminal INPUT is input with the high-level signal, the fifth transistor T5 and the tenth transistor T10 are both turned on, so that the second voltage inputted by the second voltage terminal VFD charges the first node PU, so that the potential of the first node PU is pulled up to a first high level while the potential of the first control node N1 is pulled up to a high level.

Because the clock signal terminal CLK is input with the low-level clock signal, the first transistor T1 is turned off. Because the third transistor T3 adopts a diode connection mode, the second node PD can discharge to a low level through the third transistor T3 and the clock signal terminal CLK, thereby reducing the influence of the second node PD on the first node PU, and enabling the first node PU to be pulled up to a higher level during the input stage A.

Because the first node PU is at the first high level, the seventh transistor T7 is turned on. Because the clock signal terminal CLK is input with a low-level clock signal at this time, so during this stage, the output terminal OUT outputs the low-level signal.

In the output stage B, the clock signal terminal CLK is input with a high-level clock signal, and the input terminal INPUT is input with a low-level signal. The fifth transistor T5 and the tenth transistor T10 are turned off, and the potential of the first control node N1 is lowered to a low level due to coupling, for example, due to parasitic capacitance coupling of the transistors. Because the first node PU maintains the high level of the previous stage, thereby keeping the seventh transistor T7 to be in a turn-on state, the output terminal OUT outputs the high-level signal inputted by the clock signal terminal CLK during this stage.

Because the clock signal terminal CLK and the output terminal OUT are at a high level, the high level can raise, by coupling, the potential of the first node PU to a second high level through a parasitic capacitance of the seventh transistor T7 (including a parasitic capacitance between the gate electrode of the seventh transistor T7 and the first electrode of the seventh transistor T7, and a parasitic capacitance between the gate electrode of the seventh transistor T7 and the second electrode of the seventh transistor T7) and the storage capacitance C1, which causing the seventh transistor T7 to be fully turned on.

The high-level clock signal inputted by the clock signal terminal CLK can turn on the first transistor T1, the clock signal charges the second node PD, while the high level of the first node PU turns on the second transistor T2, thus lowering the level of the second node PD. For example, in a design of the transistors, the first transistor T1 and the second transistor T2 can be configured (e.g., size ratios, threshold voltages and the like of the first transistor T1 and the second transistor T2) when both transistors T1 and T2 are turned on, the potential of the second node PD is pulled down to a lower level, which does not turn on the eighth transistor T8 and the ninth transistor T9.

In the reset stage C, because the first reset terminal RST1 is input with a high-level first reset signal, the sixth transistor T6 and the twelfth transistor T12 are turned on, the first node PU is electrically connected to the third voltage terminal VBD, and the potential of the first node PU is pulled down to the low level, so that the second transistor T2 and the seventh transistor T7 are turned off.

Because the clock signal terminal CLK is input with a low-level clock signal at this stage, similar with the input stage, the second node PD can be discharged to a low level through the third transistor T3 and the clock signal terminal CLK. Because the second node PD is at a low level, the eighth transistor T8, the ninth transistor T9, the eleventh transistor T11, and the thirteenth transistor T13 are turned off.

In the subsequent stages after the reset stage C, when the clock signal terminal CLK is input with a high-level clock signal, the clock signal can charge the second node PD through the first transistor T1, so that the potential of the second node PD becomes to a high level; when the clock signal terminal CLK is input with a low-level clock signal, the second node PD can be discharged to a low level through the third transistor T3 and the clock signal terminal CLK. That is, in the subsequent stages after the reset stage, the potential of the second node PD can follow the change of the clock signal. In addition, when the potential of the second node PD is at a high level, the eleventh transistor T11 is turned on, so that the first control node N1 can be further discharged.

In addition, the high-level second reset signal can be provided through the second reset terminal RST2 in the blanking time between two display frames, and the fourteenth transistor T14 and the fifteenth transistor T15 are turned on in response to the second reset signal, so that a reset operation can be simultaneously performed on the first nodes PU of all shift register units in the gate driving circuit, and noise reduction can be simultaneously performed on the output terminals OUT of all shift register units in the gate driving circuit.

With the shift register unit 100 as shown in FIG. 9, the potential of the second node PD can be kept at a low level in the input stage, thereby reducing the influence of the second node PD on the first node PU, so that the first node PU can be pulled up to a higher level in the input stage. In addition, in the subsequent stages after the reset stage, the potential of the second node PD can follow the change of the clock signal, so that the potential of the second node PD is kept at a low level for about 50% of the time in one display frame, thereby causing the transistors directly connected with the second node PD to be unstressed for about 50% of the time in one display frame, and further prolonging the service life of the transistors directly connected to the second node PD.

In addition, the shift register unit 100 as shown in FIG. 9 can further enable the tenth transistor T10 to remain in a zero bias state for most of the time of one display frame, thereby eliminating the risk of negative shift of threshold voltage, preventing the first node PU from forming a leakage path after switching the scanning direction, preventing the output terminal OUT from not outputting normally, and enhancing the reliability of the circuit.

For example, in a case where the shift register unit 100 as shown in FIG. 9 performs the backward scanning, it is sufficient to exchange the input signal and the first reset signal with each other, that is, the input terminal INPUT is input with the first reset signal and the first reset terminal RST1 is input with the input signal. At this time, the second voltage terminal VFD is input with the DC low-level signal, while the third voltage terminal VBD is input with the DC high-level signal. In a case where the shift register unit 100 performs the backward scanning, the operation principle of the shift register unit 100 is similar to that during the forward scanning and will not be described again.

Figure 11:
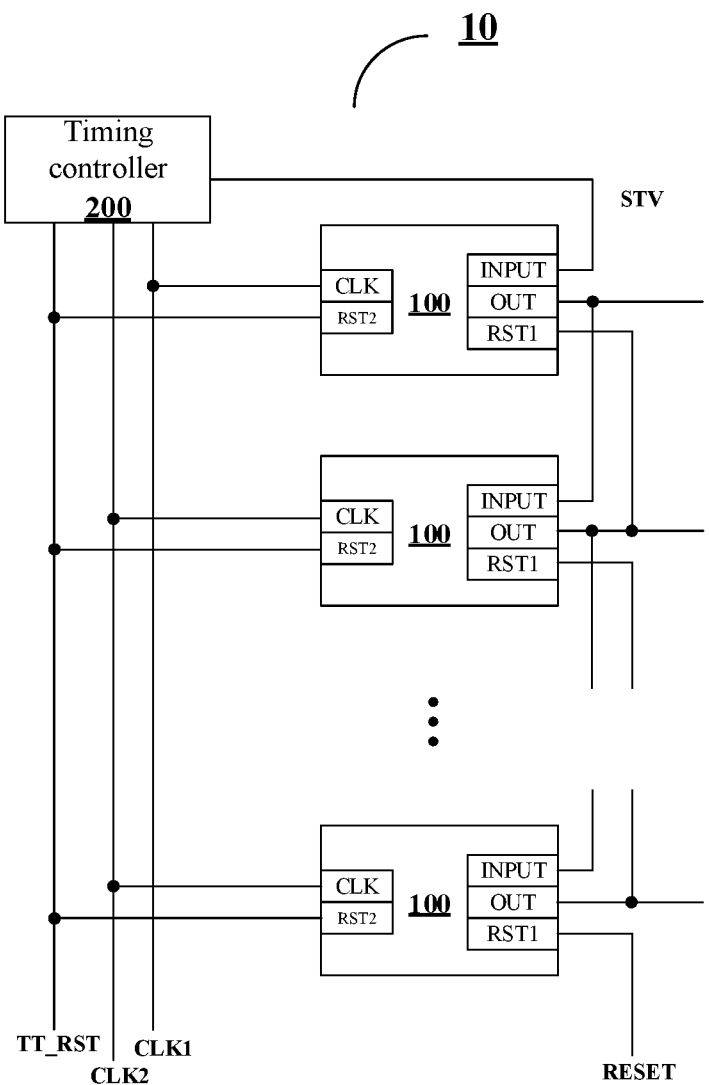
FIG. 11 is a schematic diagram of a gate driving circuit provided by an embodiment of the present disclosure.

At least one embodiment of the present disclosure further provides a gate driving circuit 10, as shown in FIG. 11, the gate driving circuit 10 includes a plurality of cascaded shift register units 100, for example, the shift register unit 100 may adopt the shift register unit provided in the above embodiments. The gate driving circuit 10 can be directly integrated on an array substrate of a display device by adopting the processes similar to those for forming a thin film transistor, and can realize the function of performing the progressive scanning.

For example, as shown in FIG. 11, except the first-stage shift register unit, an input terminal INPUT of any one of the shift register units of the other stages is connected to an output terminal OUT of the shift register unit of the preceding stage. Except the last-stage shift register unit, a first reset terminal RST1 of any one of the shift register units of the other stages is connected to an output terminal OUT of the shift register unit of the next stage. For example, the input terminal INPUT of the first-stage shift register unit can be configured to receive a trigger signal STV, and the first reset terminal RST1 of the last-stage shift register unit can be configured to receive a reset signal RESET. Of course, the above is a case of the forward scanning. In a case where the shift register unit performs the backward scanning, the trigger signal STV for the first-stage shift register unit is replaced with the reset signal RESET, and the reset signal RESET for the last-stage shift register unit is replaced with the trigger signal STV.

For example, the gate driving circuit 10 can further include a first clock signal line CLK1 and a second clock signal line CLK2. For example, the first clock signal line CLK1 can be configured to be connected to the clock signal terminals CLK of the odd-stage shift register units 100, and the second clock signal line CLK2 can be configured to be connected to the clock signal terminals CLK of the even-stage shift register units 100.

It should be noted that the embodiment of the present disclosure includes but is not limited to this. For example, the first clock signal line CLK1 can also be configured to be connected to the clock signal terminals CLK of the even-stage shift register units 100, while the second clock signal line CLK2 can also be configured to be connected to the clock signal terminals CLK of the odd-stage shift register units 100.

Figure 12:
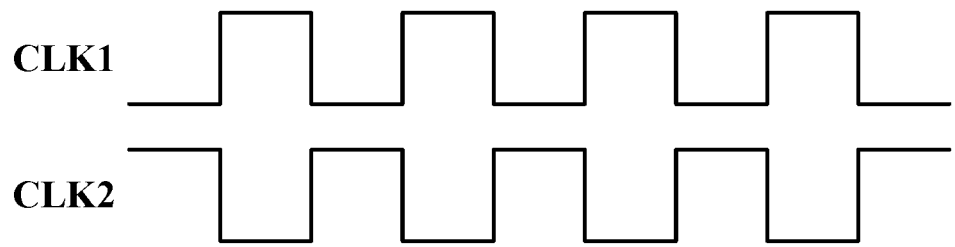
FIG. 12 is a signal timing diagram corresponding to an operation process of the gate driving circuit as shown in FIG. 11.

For example, the clock signal timing provided by the first clock signal line CLK1 and the second clock signal line CLK2 can adopt the signal timing as shown in FIG. 12, which are complementary to each other.

It should be noted that in different examples, according to different configurations, more clock signal lines can be adopted to provide more clock signals, such as 4, 6, etc.

For example, the gate driving circuit 10 can further include a frame reset signal line TT_RST, and the frame reset signal line TT_RST is configured to be connected to the second reset terminal RST2 of each stage shift register 100.

For example, as shown in FIG. 11, the gate driving circuit 10 can further include a timing controller 200. The timing controller 200 is configured, for example, to provide the clock signal to each shift register unit 100, and the timing controller 200 can further be configured to provide the trigger signal STV and the reset signal RESET.

The technical effects of the gate driving circuit 10 provided by the embodiments of the present disclosure can be described with reference to the corresponding descriptions of the shift register unit 100 in the above embodiment, and details are not described herein again.

Figure 13:
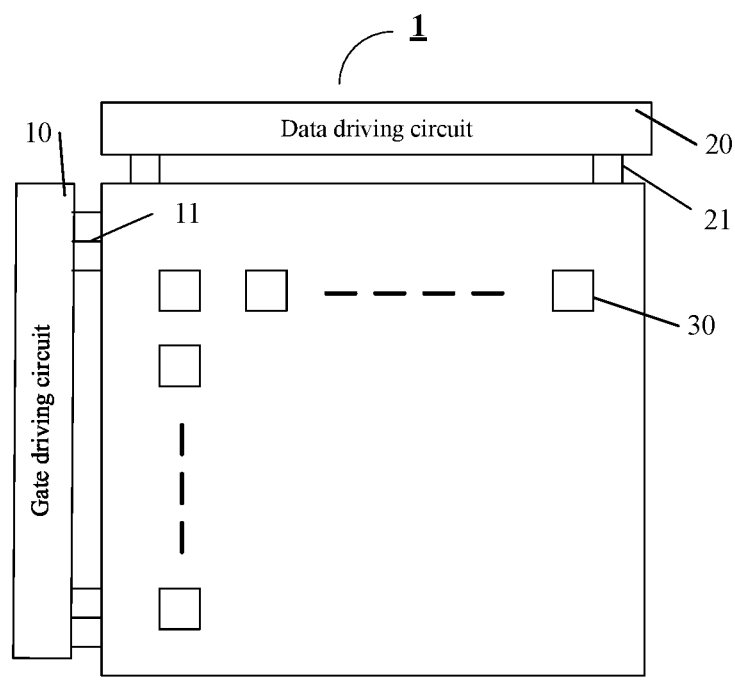
FIG. 13 is a schematic block diagram of a display device provided by an embodiment of the present disclosure.

At least one embodiment of the present disclosure further provides a display device 1, as shown in FIG. 13, the display device 1 includes any one of the gate driving circuit 10 provided in the embodiment of the present disclosure. The display device 1 includes an pixel array of a plurality of pixel units 30. For example, the display device 1 can further include a data driving circuit 20. The data driving circuit 20 is used for providing data signals to the pixel array; the gate driving circuit 10 is used to provide gate scanning signals to the pixel array. The data driving circuit 20 is electrically connected to the plurality of pixel units 30 through data lines 21, and the gate driving circuit 10 is electrically connected to the pixel units 30 through gate lines 11.

It should be noted that the display device 1 in this embodiment can be a liquid crystal panel, a liquid crystal television, a display, an OLED panel, an OLED television, an electronic paper, a mobile phone, a tablet computer, a notebook computer, a digital photo frame, a navigator and other products or members having display function. The display device 1 further includes other conventional components, such as a display panel, which are not limited by the embodiments of the present disclosure.

The technical effects of the display device 1 provided by the embodiments of the present disclosure can be described with reference to the corresponding descriptions of the shift register unit 100 in the above embodiment, and details are not described herein again.

At least one embodiment of the present disclosure further provides a driving method which can be used to drive any one of the shift register unit 100 provided in the embodiments of the present disclosure, in which the node control circuit 140 controls the level of the second node PD in response to the driving signal. For example, the second node PD is alternately discharged and charged, so that the potential of the second node PD changes alternately between a low level and a high level. For example, the clock signal can be received through the clock signal terminal CLK and used as the driving signal. For example, in a specific example, the driving method includes the following operations.

In a first stage (for example, the input stage), the input circuit 110 charges the first node PU in response to the input signal, the output circuit 130 outputs the low level of the clock signal to the output terminal OUT, and the node control circuit 140 discharges the second node PD in response to the low level of the clock signal, so that the potential of the second node PD remains in a low level.

In a second stage (for example, the output stage), the output circuit 130 outputs the high level of the clock signal to the output terminal OUT under control of the level of the first node PU; the node control circuit 140 charges the second node PD in response to the high level of the clock signal, but at the same time, the node control circuit 140 has a discharge path of the second node PD, so that the potential of the second node PD remains in a low level at this stage.

In a third stage (for example, the reset stage), the first reset circuit 120 resets the first node PU in response to the first reset signal, and the node control circuit 140 discharges the second node PD in response to the low level of the clock signal, so that the potential of the second node PD remains in a low level.

In a fourth stage (for example, the subsequent stages after the reset stage), the node control circuit 140 alternately discharges and charges the second node PD in response to the clock signal, so that the potential of the second node PD alternates between a low level and a high level.

It should be noted that, detailed descriptions and technical effects of the driving method can refer to the descriptions of the operation principle of the shift register unit 100 in the embodiment of the present disclosure, and details are not described herein again.

What have been described above are only specific implementations of the present disclosure, the protection scope of the present disclosure is not limited thereto. The protection scope of the present disclosure should be based on the protection scope of the claims.

What is claimed is:

1. A shift register unit, comprising an input circuit, a first reset circuit, an output circuit and a node control circuit,
    wherein the input circuit is configured to control a level of a first node in response to an input signal;
    the first reset circuit is configured to reset the first node in response to a first reset signal;
    the output circuit is configured to output a driving signal to an output terminal under control of the level of the first node; and
    the node control circuit is configured to control a level of a second node in response to the driving signal,
    wherein the node control circuit comprises a first transistor, a second transistor and a third transistor;
    a gate electrode of the first transistor and a first electrode of the first transistor are connected to a clock signal terminal to receive a clock signal and the clock signal is used as the driving signal, and a second electrode of the first transistor is connected to the second node;
    a gate electrode of the second transistor is connected to the first node, a first electrode of the second transistor is connected to the second node, and a second electrode of the second transistor is connected to a first voltage terminal to receive a first voltage; and
    a gate electrode of the third transistor and a first electrode of the third transistor are connected to the second node, and a second electrode of the third transistor is connected to the clock signal terminal.

2. The shift register unit according to claim 1, further comprising a node noise reduction circuit and a first output noise reduction circuit,
    wherein the node noise reduction circuit is configured to reduce noise on the first node under control of the level of the second node; and
    the first output noise reduction circuit is configured to reduce noise on the output terminal under control of the level of the second node.

3. A shift register unit, comprising an input circuit, a first reset circuit, an output circuit and a node control circuit,
    wherein the input circuit is configured to control a level of a first node in response to an input signal;
    the first reset circuit is configured to reset the first node in response to a first reset signal;
    the output circuit is configured to output a driving signal to an output terminal under control of the level of the first node; and
    the node control circuit is configured to control a level of a second node in response to the driving signal,
    wherein the node control circuit comprises a first transistor, a second transistor, a third transistor and a fourth transistor;
    a gate electrode of the first transistor and a first electrode of the first transistor are connected to a clock signal terminal to receive a clock signal and the clock signal is used as the driving signal, and a second electrode of the first transistor is connected to a third node;
    a gate electrode of the second transistor is connected to the first node, a first electrode of the second transistor is connected to the third node, and a second electrode of the second transistor is connected to a first voltage terminal to receive a first voltage;
    a gate electrode of the third transistor is connected to the third node, a first electrode of the third transistor is connected to the clock signal terminal to receive the clock signal and the clock signal is used as the driving signal, and a second electrode of the third transistor is connected to the second node; and
    a gate electrode of the fourth transistor is connected to the first node, a first electrode of the fourth transistor is connected to the second node, and a second electrode of the fourth transistor is connected to the first voltage terminal to receive the first voltage.

4. The shift register unit according to claim 1, wherein the input circuit comprises a fifth transistor;
    a gate electrode of the fifth transistor is connected to an input terminal to receive the input signal, a first electrode of the fifth transistor is connected to a second voltage terminal to receive a second voltage, and a second electrode of the fifth transistor is connected to the first node.

5. The shift register unit according to claim 1, wherein the first reset circuit comprises a sixth transistor;

a gate electrode of the sixth transistor is connected to a first reset terminal to receive the first reset signal, a first electrode of the sixth transistor is connected to a third voltage terminal to receive a third voltage, and a second electrode of the sixth transistor is connected to the first node.

6. The shift register unit according to claim 1, wherein the output circuit comprises a seventh transistor and a storage capacitor;
a gate electrode of the seventh transistor is connected to the first node, a first electrode of the seventh transistor is connected to a clock signal terminal to receive a clock signal and the clock signal is used as the driving signal, and a second electrode of the seventh transistor is connected to the output terminal; and
a first electrode of the storage capacitor is connected to the first node, and a second electrode of the storage capacitor is connected to the output terminal.

7. The shift register unit according to claim 2, wherein the node noise reduction circuit comprises an eighth transistor;
a gate electrode of the eighth transistor is connected to the second node, a first electrode of the eighth transistor is connected to the first node, and a second electrode of the eighth transistor is connected to a first voltage terminal to receive a first voltage.

8. The shift register unit according to claim 2, wherein the first output noise reduction circuit comprises a ninth transistor;
a gate electrode of the ninth transistor is connected to the second node, a first electrode of the ninth transistor is connected to the output terminal, and a second electrode of the ninth transistor is connected to a first voltage terminal to receive a first voltage.

9. The shift register unit according to claim 1,
wherein a first control node is provided in a path where the input circuit controls the level of the first node, and the input circuit is further configured to control a level of the first control node.

10. The shift register unit according to claim 9,
wherein the input circuit is configured to connect the first control node to a first voltage terminal under control of the level of the second node.

11. The shift register unit according to claim 10, wherein the input circuit comprises a fifth transistor, a tenth transistor and an eleventh transistor;
a gate electrode of the fifth transistor is connected to an input terminal to receive the input signal, a first electrode of the fifth transistor is connected to a second voltage terminal to receive a second voltage, and a second electrode of the fifth transistor is connected to the first control node;
a gate electrode of the tenth transistor is connected to the input terminal to receive the input signal, a first electrode of the tenth transistor is connected to the first control node, and a second electrode of the tenth transistor is connected to the first node; and
a gate electrode of the eleventh transistor is connected to the second node, a first electrode of the eleventh transistor is connected to the first control node, and a second electrode of the eleventh transistor is connected to the first voltage terminal.

12. The shift register unit according to claim 9,
wherein the input circuit is configured to connect the first control node to an input terminal under control of a level of the first control node, and the input terminal is configured to receive the input signal.

13. The shift register unit according to claim 12, wherein the input circuit comprises a fifth transistor, a tenth transistor and an eleventh transistor;
a gate electrode of the fifth transistor is connected to the input terminal to receive the input signal, a first electrode of the fifth transistor is connected to a second voltage terminal to receive a second voltage, and a second electrode of the fifth transistor is connected to the first control node;
a gate electrode of the tenth transistor is connected to the input terminal to receive the input signal, a first electrode of the tenth transistor is connected to the first control node, and a second electrode of the tenth transistor is connected to the first node; and
a gate electrode of the eleventh transistor and a first electrode of the eleventh transistor are connected to the first control node, and a second electrode of the eleventh transistor is connected to the input terminal.

14. The shift register unit according to claim 1, wherein the first reset circuit and the input circuit are symmetrically configured to allow bidirectional scanning.

15. The shift register unit according to claim 1, further comprising a second reset circuit and a second output noise reduction circuit,
wherein the second reset circuit is configured to reset the first node in response to a second reset signal; and
the second output noise reduction circuit is configured to reduce noise on the output terminal in response to the second reset signal.

16. The shift register unit according to claim 15,
wherein the second reset circuit comprises a fourteenth transistor,
a gate electrode of the fourteenth transistor is connected to a second reset terminal to receive the second reset signal, a first electrode of the fourteenth transistor is connected to the first node, and a second electrode of the fourteenth transistor is connected to a first voltage terminal to receive a first voltage; and
the second output noise reduction circuit comprises a fifteenth transistor,
a gate electrode of the fifteenth transistor is connected to the second reset terminal to receive the second reset signal, a first electrode of the fifteenth transistor is connected to the output terminal, and a second electrode of the fifteenth transistor is connected to the first voltage terminal to receive the first voltage.

17. A gate driving circuit, comprising a plurality of cascaded shift register units each of which is according to claim 1.

18. A display device, comprising the gate driving circuit according to claim 17.

19. A driving method of the shift register unit according to claim 1, comprising:
causing the node control circuit to control the level of the second node in response to the driving signal.

* * * * *